(12) United States Patent
Oggioni et al.

(10) Patent No.: US 7,703,201 B2
(45) Date of Patent: Apr. 27, 2010

(54) METHOD OF EMBEDDING TAMPER PROOF LAYERS AND DISCRETE COMPONENTS INTO PRINTED CIRCUIT BOARD STACK-UP

(75) Inventors: Stefano Sergio Oggioni, Milan (IT); Vincenzo Condorelli, Poughkeepsie, NY (US); Nihad Hadzic, Wappingers Falls, NY (US); Kevin C. Gotze, Poughkeepsie, NY (US); Tamas Visegrady, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 931 days.

(21) Appl. No.: 11/163,609

(22) Filed: Oct. 25, 2005

(65) Prior Publication Data
US 2006/0086534 A1    Apr. 27, 2006

(30) Foreign Application Priority Data
Oct. 25, 2004    (EP)    .................................. 04300715

(51) Int. Cl.
*H01K 3/00* (2006.01)
(52) U.S. Cl. ....................................................... 29/846
(58) Field of Classification Search ................... 29/846, 29/849
See application file for complete search history.

(56) References Cited

U.S. PATENT DOCUMENTS

| | | | | |
|---|---|---|---|---|
| 4,877,554 A | * | 10/1989 | Honma et al. | 252/511 |
| 5,066,692 A | * | 11/1991 | Isawa et al. | 523/458 |
| 5,531,020 A | * | 7/1996 | Durand et al. | 29/840 |
| 5,531,942 A | * | 7/1996 | Gilleo et al. | 264/5 |
| 6,229,098 B1 | * | 5/2001 | Dunn et al. | 174/260 |
| 6,772,515 B2 | * | 8/2004 | Suwa et al. | 29/847 |
| 2002/0125486 A1 | * | 9/2002 | Kondo et al. | 257/79 |

* cited by examiner

*Primary Examiner*—Jeremy C Norris
(74) *Attorney, Agent, or Firm*—Steve Capella; Joseph Petrokaitis

(57) ABSTRACT

A method for embedding tamper proof layers and discrete components into a printed circuit board stack-up is disclosed. According to this method, a plating mask is applied on a base substrate to cover partially one of its faces. Conductive ink is then spread on this face so as to fill the gap formed by the plating mask. To obtain a uniform distribution of the conductive ink and then gel it, the conductive ink is preferably heated. A dielectric layer is applied on the conductive ink layer and the polymerization process is ended to obtain a strong adhesion between these two layers. In a preferred embodiment, conductive tracks are simultaneously designed on the other face of the base substrate to reduce thermo-mechanical strains and deformations.

13 Claims, 5 Drawing Sheets

METHOD OF EMBEDDING TAMPER PROOF LAYERS AND DISCRETE COMPONENTS INTO PRINTED CIRCUIT BOARD STACK-UP

FIELD OF THE INVENTION

The present invention relates generally to electronic packages and to secure electronic packages and more specifically to a method of embedding tamper proof layers and discrete components into printed circuit board stack-up.

BACKGROUND OF THE INVENTION

According to the Department of Commerce of the United States of America, all secure cryptographic application are classified according to one of four possible levels listed in the technical specification untitled "Security requirements for cryptographic modules" published in the Federal Information Processing Standards FIPS PUB 140-2 by the national Institute of Standards and Technology (NIST). This standard specifies the security requirements that must be satisfied by a cryptographic module to be utilized within a security system, protecting sensitive but unclassified information. The standard provides four increasing qualitative levels of security that are intended to cover a wide range of potential applications and environments in which cryptographic modules may be used.

Electronic packages to be used for FIPS certified applications have a very important function beyond the classical mechanical protection for the embedded semiconductor devices. They ultimately need to maintain the security of the cryptographic keys and algorithm stored within the module. One of the requirement of the highest level of security (FIPS 140 level 4) is the capability to detect and respond to physical intrusion attempts. Such security is provided, in particular, by using tamper proof layers avoiding the undetected penetration of microprobes that can be used to read information from outside of the secure boundaries of the electronic package.

Basically, tamper proof layers comprise a sequence of layers with a combination of different techniques and properties to allow detection by an electronic monitoring system of tamper attempts. When such event is sensed, a security system disables the module, clearing all sensitive information stored in a volatile memory within the electronic package. From the security point of view, the tamper attempts are detected when circuits change their electrical properties from a previous balanced and characterized level. These protection layers are capable of preventing the creation of holes, to introduce electrical microprobes, made by any kind of technique such as micro-drilling with ceramic drills or laser and selective layer ablation. They are also made difficult to work with, for example due to intrinsic material/layer fragility when tampered (very low thickness, brittle layers, not solderable) such as to prevent shunting of the electrical circuit.

To preserve and to extend the life of the battery back-ups, these circuits are preferably made of highly resistive conductive materials drawing low current versus the utilization of low ohmic conductive lines.

The engineering of these electronic packages can drive to solutions where several of the manufacturing steps can be updated to include features that, from the security point of view, are relevant in meeting specifics anti-tampering needs.

The secure module definition i.e., the structure of the implemented layers, is taking advantage of the different possible combinations of stacking these layers for meeting the different levels of security for more generic commercial applications beyond the FIPS requirements.

FIG. 1 illustrates an example of tamper proof layers combined with a printed circuit board. As shown, the whole electronic package 100 comprises a Printed Circuit Board (PCB) 105 carrying electronic devices or chips. For sake of illustration PCB 105 carries chips 110-1 and 110-2, a volatile memory 115 wherein sensitive information is stored, and a battery 120. PCB 105 is insulated by a dielectric layer 125 on top of which conductive tracks 135 can be designed in conductive layer 130. Likewise, conductive layer 130 is insulated by a dielectric layer 140 on top of which conductive tracks 150 can be designed in conductive layer 145. Conductive layer 145 is protected by the dielectric layer 155. According to this system, a short is established between conductive tracks 135 and 150 when inserting a conductive microprobe in a hole drilled in layers 155 to 125, as depicted by arrows 160. The use of wires 165-1 and 165-2, combined with battery 120, allows to reset volatile memory 115 so as to erase sensitive information contained therein.

However, if the system described by reference to FIG. 1 is adapted to detect shorts created between conductive tracks 135 and 150 when using conductive drills or microprobes, it can not detect a tamper attempt done with insulated tools. To detect such attempt, the conductive tracks 135 and 150 are generally very small in dimensions (line width and gaps between lines) and designed according to schemes similar to the one presented on FIG. 2 wherein an open can be easily detected.

The tamper layers as described above are efficient but are very expensive and cumbersome to produce. For example, a current application consists of a Peripheral Component Interconnect (PCI) card placed into a pair of copper covers that are then riveted together and gift-wrapped with a polymer film that carries a pattern of carbon ink defining a resistive network on its two sides. Once the film is placed all around, the package is placed into an Aluminum box, open on one side, and the whole assembly is then potted with a polyurethane resin. From the formed 'brick', only a flat cable is exiting to establish the electrical connection with the system's electronic.

False calls during the manufacturing operations and in the field show the limits of the current solution. The erasing of the cryptographic code causes the replacement of units at customer's sites. Furthermore, such solution presents several drawbacks such as bowing, that has been identified as one of the effects responsible for false tamper calls. There are few mechanism that can trigger the bowing of the secure package that at the end tears, breaks or rips the resistive carbon traces off from their flexible support.

A) The resin potting of the wrapped and the riveted covers, containing the card, creates a multi-materials combination with mutually induced effects on their own different physical properties, such as coefficient of thermal expansion (CTE), Young's or elastic module, Poisson's ratio and other physical properties. As all electronic products the functioning of the electronics will generate heat and consequently materials expansion that consequently will start applying various kind of stress to the package. One of higher concern is localized bowing that causes elongation and eventually failure of the highly resistive tracks of the secure mesh triggering a tamper-sensing.

B) the same mechanism of point (A) gets worsened with the possible presence of moisture. As all the plastic electronic packages using plastic polymers sealing that is not moisture proof, moisture is absorbed by the polymer in time, and gets desorbed with thermal cycles. Desorption is increasing the availability of water within a constrained air pockets. Rapid thermal cycle may generate steam, creating condition for sudden and localized formation of high pressure steam, this is also known as "Pop corn" effect, i.e. Inside air bubbles within the potting polymer, that trigger localized pressure/expansion of the material.

C) Along the same line of physics laws, another interesting effect is in the shipping procedures with transits or legs of journey in low pressure environment, like an airplane cargo where the outside depressurized environment poses a challenge in the shipping procedures. The polymer film with exposed resistive traces show limits during handling and the gift-wrapping of the box. The resulting lines abrasion breaks the resistive network. The resistive matrix folded around the box is using an electrically conductive isotropic adhesive that shows temperature dependencies and batch to batch performance changes.

Thus, there is a need to remedy the shortcomings of the prior art as described here above.

SUMMARY OF THE INVENTION

One object of the invention to provide a method for manufacturing improved tamper proof layers into a printed circuit board stack-up.

It is a further object of the invention to provide a method for manufacturing improved tamper proof layers into a printed circuit board stack-up using standard manufacturing processes.

It is another object of the invention to provide a method for manufacturing embedded discrete elements into build up printed circuit boards using a standard manufacturing process for build-up electronic substrates.

It is a further object of the invention to provide a method for manufacturing embedded resistor elements into build up printed circuit boards using a standard manufacturing process for build-up electronic substrates.

In one aspect, the invention encompasses a method for embedding at least one conductive track in a layer of a printed circuit board stack-up, said method comprising the steps of:
applying a first plating mask covering partially at least one face of a base substrate;
applying conductive ink as paste in the gap formed by said plating mask covering partially at least one face of said base substrate;
liquefying said conductive ink to facilitate uniform distribution;
gelling said conductive ink;
applying a dielectric layer on said conductive ink; and
solidifying said conductive ink and said dielectric layer, In an other aspect, the invention encompasses a method for embedding a layer hosting discrete components into a printed circuit board stack-up, said method comprising the steps of:
applying a first plating mask covering partially at least one face of a base substrate;
applying conductive ink as paste in the gap formed by said plating mask covering partially at least one face of said base substrate;
liquefying said conductive ink to facilitate uniform distribution;
gelling said conductive ink;
applying a dielectric layer on said conductive ink; and,
solidifying said conductive ink and said dielectric layer, The invention also encompasses a printed circuit board stack-up comprising at least one conductive track or discrete components such as integrated resistive discrete components embedded thereto.

These and other aspects of the invention are described in further detail below.

BRIEF DESCRIPTION OF THE DRAWINGS

FIG. 6, comprising

DETAILED DESCRIPTION OF THE INVENTION

Figure 1:
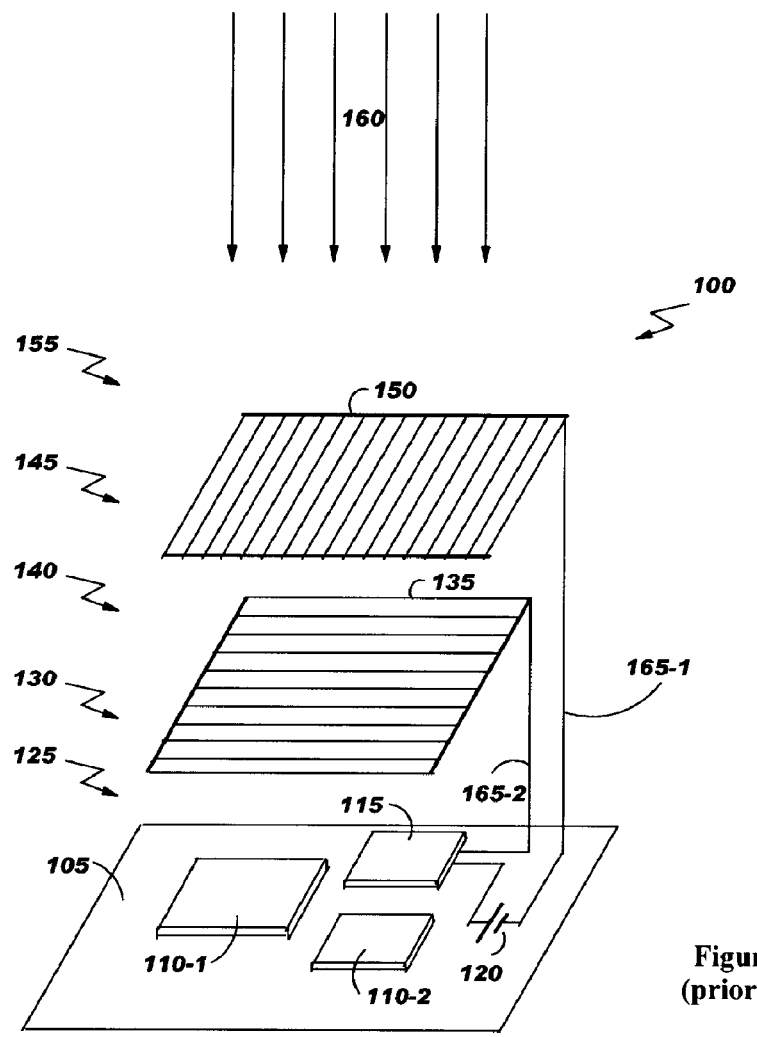
FIG. 1 is a partial perspective view of an electronic package comprising tamper proof layers.
Figure 2:
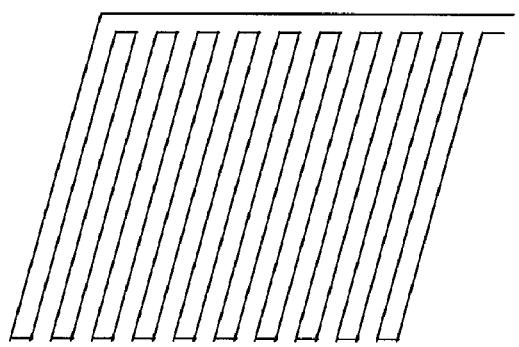
FIG. 2 illustrates a particular conductive track design of the tamper proof layer allowing the detection of tamper attempt done with insulated tools.

According to the invention a conductive ink, preferably a conductive polymeric ink, is placed into a precise pattern embedded into the module laminate stack-up construction.

In a preferred embodiment the printed circuit substrate is built in respect of symmetry to control mechanical behaviors like induce warpage from differential PCB materials shrinkage (metal, glass, plastic) because these thermo-mechanical strains and deformations are exacerbated when a non symmetrical construction is used. This problem is true also for recent developed technologies where layers are added on a rigid core, that can be a multilayer substrate, made of classical stack up of woven glass cloths impregnated with resins and copper sheets etched with circuit patterns. The reinforced or non-reinforced cores and may include an epoxy, polyester, cyanate ester, bismaleimide triazine, polyphenylene ether, annylated polyphenylene ether, polynorborene, liquid crystal polymer (LCP), Teflon, polyimide or resinous material, and mixture thereof, as is conventionally known.

In recent years and under a strong pressure to achieve miniaturization, the PCB technology has evolved in adding layers using a photolithographic technique also for the dielectric layers where the dielectric is made of pure resin and no glass fibers are present. With the implementation of these added layers, referred in the industry as Build-up layers, a new approach for copper plating process, with a much greater definition capability, has been taking place replacing the most commonly used subtractive process. The difference is consistent with the naming, where "Subtractive" basically remove copper wherever is not needed starting from a full plated panel by a photolithographic process of a protecting mask. This process is not capable to define very small geometries. The resulting conductor trace shape has a trapezoidal connotation, with a larger base than the top side of the conductor.

The newly adopted additive plating basically represents the opposite approach, the path here is to add copper only where is needed. To do so a temporary plating mask is obtained by photolithography on the panels and then, thanks to the presence of a colloidal seeding layer in these areas, copper is plated only into the open spaces. The main steps of such process are, colloidal seeding deposition;
mask material deposition;
mask definition by photolithography;

plating of copper in the trenches;
removal (stripping) of the plating mask;
removal of the colloidal (flash-etch) being exposed from the mask removal; and,
deposition of the new dielectric material covering the traces and preparing a flat surface for the generation of a new wiring layer.

According to the present invention it is possible to plate copper on one side of the laminate while screen printing the conductive inks on the opposite side. The solution lays in the fact that the same polymer pattern created for copper plating is then used as a mask to receive the conductive ink.

In a further embodiment of the invention on the ink side of the carrier, a different polymer can also be used, this material has to be compatible to the PCB base material and related processes would not require to be removed/stripped and can be left on board becoming integrated within the board construction.

Typical conductive ink formulation contains a thermosetting binder resin system such as epoxy resin or a blend of resins, a cross-linking agent such as methoxymethylamine, a catalyst such as an acid, a particle filler that may defines electrical/thermal/optical properties of the ink and an organic solvent. Formulations are also addressing desired properties that the conductive ink should provide such as: good rheological properties for screen printability and stability at relatively high temperatures on the substrate, so that it is not affected by any heat treatment which may be necessary in the manufacturing cycle. Optional ingredients like flow additives, adhesion promoters, and rheology modifiers may be included. Filler compounds which are commonly in the form of a thin powder or in particles/flakes once dispersed in the resin remain an integral part of the final composition after processing. The binder which serves as carrier for the filler particles generally consist of epoxy resin, some other currently available conductive inks also contain a phenolic resin or a mixture of resins such as acetyl-acetone with cyanic acid ester resin or acrylic resin with melamine resin or epoxy and urethane mixture.

There are also inks formulated with the usage of different binders like the ones using thermoplastic resins such as polyester adhesives, acrylic thermoplastics like methyl acrylate or methyl methacrylate resins, poly-vinyl-chloride (PVC), fluoroelastomers or cellulosic binders. Each one of these different binders is effectively addressing specific needs but may have other limitations, for example in terms of maximum operating temperature.

The selection of the fillers is defined by the level of required electrical conductivity, i.e. resistance per linear unit of a trace, needed for the application. Filler can be mono-component or mixtures of more different materials and they may comprise metals, metal oxides or alloys, such as: silver, copper, copper-oxide, gold, silver coated copper, silver coated aluminum, NiP, Ni Cr, NiCrAlSi, or other prepared materials such as metal coated mica or lead borosilicate crystalline glass or aluminum borosilicate crystalline glass powder/spheres, and compounds like carbon, graphite, or a mixture thereof.

Figure 3:
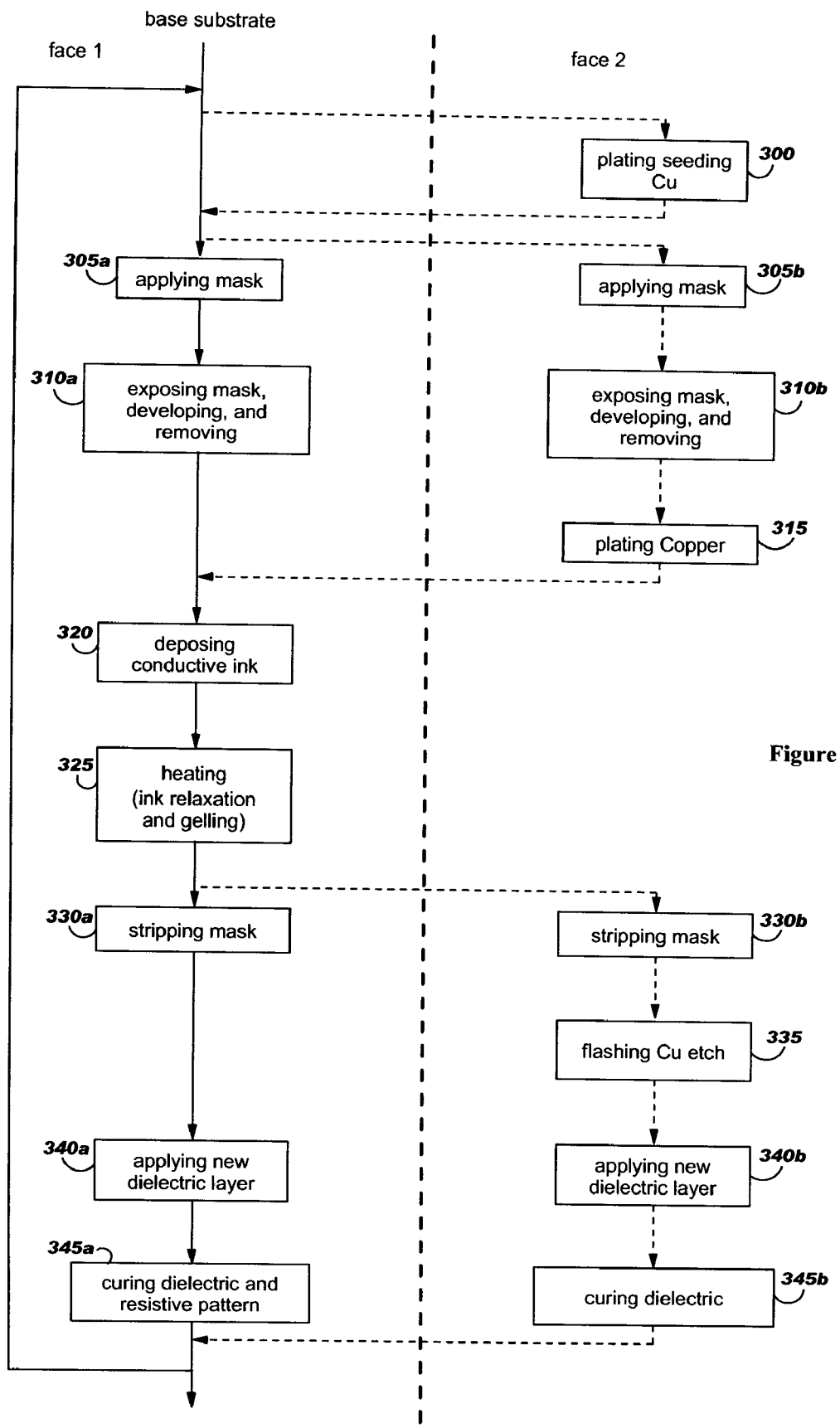
FIG. 3 illustrates the algorithm of the invention for screen printing the conductive inks.

Now turning to FIG. 3, here are illustrated the main steps of the algorithm of the invention for screen printing the conductive ink. For sake of illustration, the left part of the drawing concerns the module laminate stack-up face wherein the conductive ink is applied, referred to as face 1, while the right part illustrates the steps that can be optionally performed on the other face, referred to as face 2, to design conductive tracks e.g., copper tracks. Starting from a base substrate, a colloidal seeding copper layer can be plated on face 2 if conductive tracks have to be designed on this face (step 300). Then, a plating mask is applied on face 1 (step 305a), exposed, developed, and partially removed (step 310a) so as to create a negative print of the surface where conductive ink must be applied. The same can be simultaneously applied on face 2 (steps 305b and 310b), if required. In such case, copper is plated on colloidal seeding copper layer where plating mask has been removed (step 315). Conductive ink is then applied on face 1 where plating mask has been removed (step 320). In a preferred embodiment, conductive ink is applied as thick liquid or cream on face 1, the ink being spread on the base substrate so as to fill the gap left by the removed plating mask. Stilled in a preferred embodiment, the conductive polymeric ink is heated up to facilitate the material flow and then to a higher temperature or for a preset time to start gelling or polymerization (step 325).

After having applied conductive ink and plated copper, if required, the plating mask is stripped, or removed, (steps 330a and 330b). Preferably, the plated copper is flash-etched (step 335). Then the conductive ink and tracks are protected by applying a new dielectric layer on each face (steps 340a and 340b), or only on face 1 if not any conductive track has been designed on face 2. Finally, dielectric and resistive patterns are cured for completing polymerization of conductive ink and newly added dielectric layers prior to proceed to the generation, addition, of new layers. (step 345a and 345b). As illustrated, steps 300 to 345a and 345b can be repeated to stack several tamper proof layers and/or conductive layers.

FIGS. 4a to 4m illustrate the main steps of the algorithm depicted on FIG. 3.

Figure 4A:
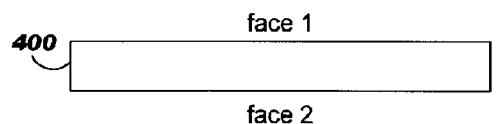
FIGS. 4a and 4m, depicts the PCB stack-up states for the main steps of the algorithm shown on FIG. 3.

FIG. 4a depicts the base substrate 400 with its upper face, referred to as face 1, wherein the conductive ink is applied and its lower face, referred to as face 2, wherein conductive tracks are optionally designed.

Figure 4B:
FIG. 4, comprising
FIG. 4n shows a structure resulting from repetition of the steps of the algorithm.

FIG. 4b illustrates the base substrate 400 when the colloidal seeding copper layer 405 has been plated on face 2, according to step 300.

Figure 4C:
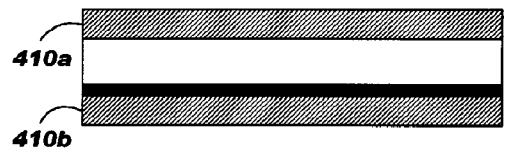

FIG. 4c shows the base substrate 400 where faces 1 and 2 are covered with plating masks 410a and 410b, according to steps 305a and 305b, respectively.

Figure 4D:
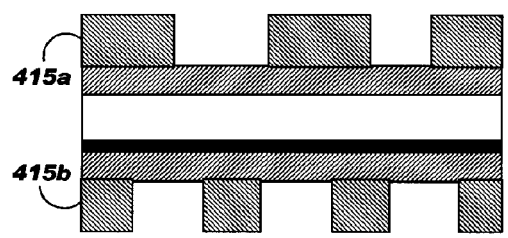
Figure 4E:
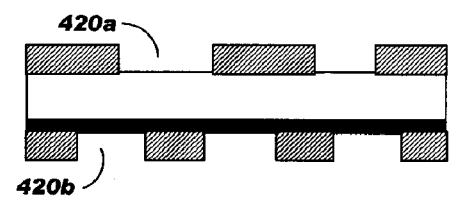

FIGS. 4d and 4e illustrate the deposit of photoresist material layers 415a and 415b, their developing and plating mask striping, corresponding to steps 310a and 310b. At the end of these steps, the plating masks 410a and 410b are partially removed so as to create holes 420a and 420b wherein conductive material must be applied.

Figure 4F:
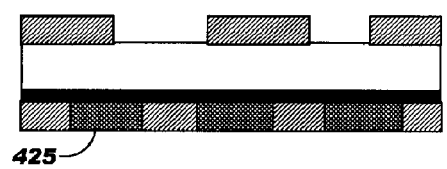

FIG. 4f depicts the base substrate 400 after copper tracks 425 have been plated on colloidal seeding copper layer 405 where plating mask has been removed, according to step 315.

Figure 4G:
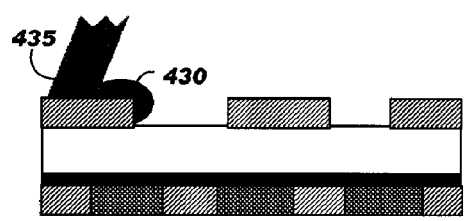
Figure 4H:
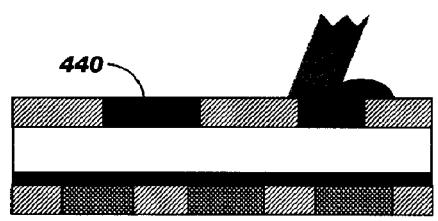

FIGS. 4g and 4h show how conductive ink 430 is spread on face 1 of base substrate 400 according to step 320. In the preferred embodiment, conductive ink 430 is applied as paste, allowing a squeegee 435 to spread it on the surface so as to fill the gaps left by the removed mask and to create conductive paths 440.

Paste must be understood here in its general meaning i.e., a material that state is somewhere between liquid and solid. As a consequence, ink paste can have different viscosity and flow properties, from almost a liquid form (viscosity at 20° C. 1,400 mPa·s or lower) up to viscous ones (>100.000 mPa·s), the selection of ink viscosity is mostly driven by the application technique. The preferred embodiment uses a screen printing technique with material having viscosity comprised in the range of about 1000 to 20.000 mPa·s.

Still according to the preferred embodiment, conductive inks are made by mixing a resin matrix with fillers made of particles that, being electrically conductive or not conductive, define the ink properties. Resins can be classified in respect of their "plastic" behavior, i.e. thermoplastics versus thermosets, or based on their molecular weight, chemistry (i.e. Vinyl, Polyurethane, Acrylic, Cellulosic) and so on.

Fillers can be Carbon based using graphite powder, carbon powder, or of metal nature with metal oxides, ceramic powders and so on. All fillers can be mixed to achieve specific electrical values.

Also colors for the ink can be tailored to the specific need using appropriate dyes, black, blue, and green are commonly available colors. The color is an important factor in making the detection of the protecting secure structures difficult. If the different materials have the same color, it becomes more difficult to appreciate where is and how is placed the protective pattern. A Black on black offers a very limited transparency in the visible light analysis but also other possible hues of blue and green are possible.

In the specific embodiment the selected ink is an epoxy based material with graphite powder as filler. The epoxy-graphite ink is not detectable by X-rays analysis neither using transmission or laminography techniques.

The epoxy selection for the ink binder is mainly to meet the material properties of the standard dielectric of the laminate substrate that is an epoxy compound. The same solder mask that can also be used as a protective agent of the conductive ink is preferably, in the selected PCB technology, an epoxy.

Figure 4I:
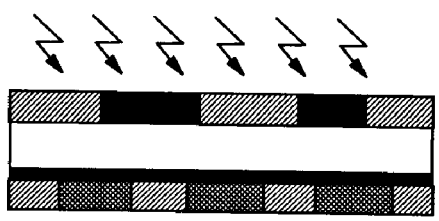

FIG. 4i illustrates the step 325 consisting in heating the conductive ink for facilitating the material flow and then starting gelling or polymerization.

As mentioned above, once screened into the trenches, the ink is brought to a higher temperature to facilitate the material flow, which fills the possible gaps left over from the screen printing operation. This "Flow time" also allows the material to become uniform in the distribution over the laminate filling correctly the channels. This flow helps then in obtaining a uniform thickness along the deposited pattern, for example reaching the required 15 μm targeted for this kind of application, compatible with the symmetry in the laminate with the opposite homologous copper plated layer.

The temperature rise, if protracted for a longer time will drive the material to transit from a flowing phase to a start of polymerization, this is a status known as "Gelling" where the flow properties are becoming significantly reduced until they stop completely. If this temperature cycle is then further incremented the real cross linking phase for the material starts, and the material freeze in its flow and shape properties.

Figure 4J:
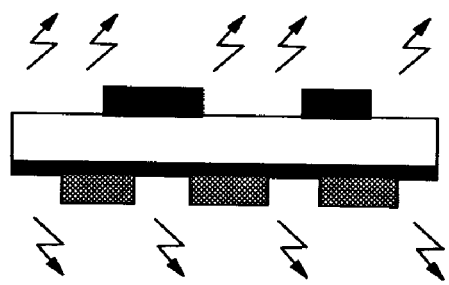

FIG. 4j depicts the striping of plating masks 410a and 410b, according to steps 330a and 330b, leaving behind the deposited conductive ink and conductive track patterns. With the stripping of the mask the excess and/or the misplaced ink is removed, obtaining a uniform definition of the resistive pattern, similarly to what are the conductive tracks e.g., copper traces in this example, on the opposite side of the substrate.

Figure 4K:
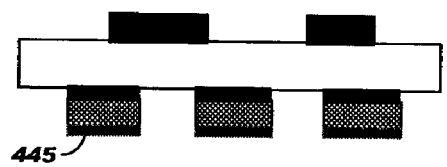

FIG. 4k shows the flash-etched plated copper 445 corresponding to step 335.

Figure 4L:
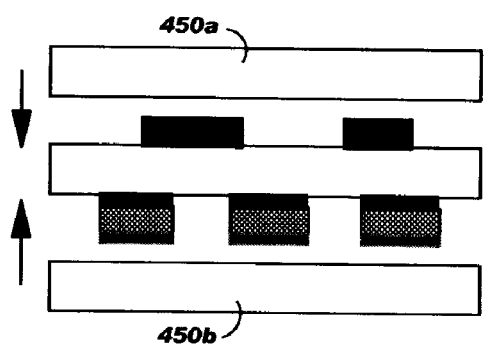

FIG. 4L illustrates the steps 340a and 340b consisting in applying new dielectric layers 450a and 450b on both faces of the base substrate 400 so as to protect conductive ink paths 440 and conductive tracks 445. This dielectric is of the same nature of the ink, i.e., achieving an epoxy on epoxy combination or other inks/dielectric combinations using similar chemistries. The dielectric deposition is performed on both sides of the laminate structure, covering copper traces on one side and the ink pattern on the other side.

Figure 4M:
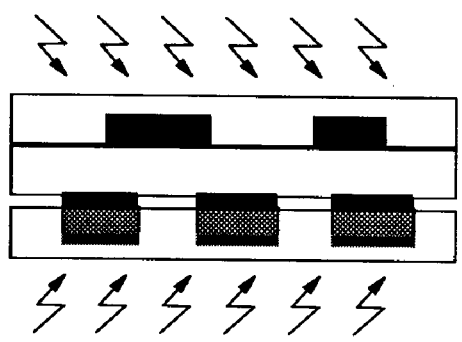
Figure 4N:
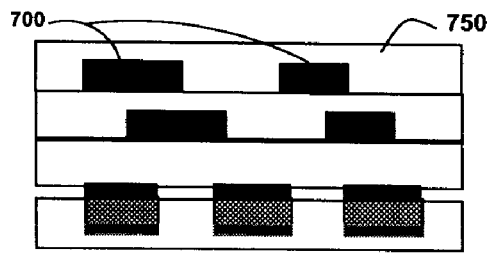

FIG. 4m illustrates the steps 345a and 345b. Once the new dielectric is deposited the material undergo a polymerization cycle that achieves branching between the polymer chains of the two materials (ink and dielectric) reaching a stronger level of adhesion between the two. This level of molecular inter-diffusion and grafting during the polymerization cycle makes the selective removal of one of the two materials very difficult to be performed. As noted above, steps 300 to 345a and 345b can be repeated to stack several tamper proof layers and/or conductive layers. An example of such a multiple tamper proof layer structure is illustrated in FIG. 4n where a second tamper proof resistive pattern 700 in dielectric 750 is provided.

Similarly an activation of the gelled or even cured polymer surface by an activator that chemically revert the surface to accept grafting from the newly deposited dielectric material is also a known technique to achieve a strong polymer to polymer adhesion.

Beyond surface activators that promote reactions in the polymers there are also adhesion promoters, like diblock copolymers that can bridge, by the presence of different blocks of repeated units capable to selectively react with one of the two, or more, resins present in the interface.

A further development would be to use a non wettable polymer by the ink to create the mask that can be left over on the laminate after ink application and cleaning of the surplus ink material.

With the deposition of the new dielectric layer a full embedding of the resistive network is obtained and with the similar chemical properties of the two materials, it becomes difficult to selectively attack one of them without attacking the other.

Figure 5:
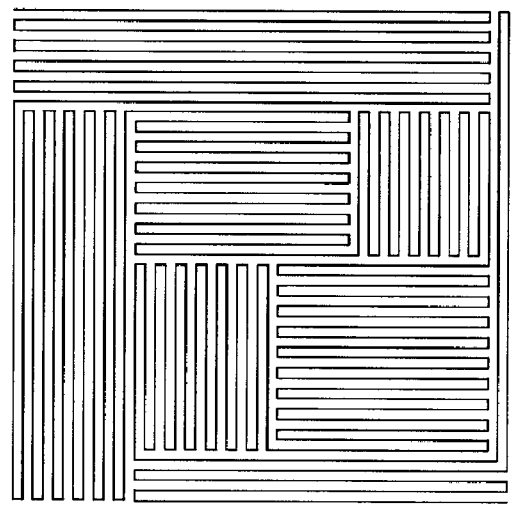
FIG. 5 depicts an example of a preferred shape for a conductive ink path of a tamper proof layer.

Improvements in the security level are obtained in creating a non predictable pattern of the secure tamper matrix, such as even if a localized analysis is done it cannot effectively predict the pattern in a nearby area as well. This is accomplished by the adoption of changes in direction of the line pattern deviating from repetitive and constant pattern configurations. Two close by lines are part of the same net but in very distant position from the resistive value, as illustrated on FIG. 5.

A further embodiment of this secure layer construction is using a different overall approach, where the secure matrix is built using colloidal graphite dispersion in a solvent (isopropanol, water) solution. This material quickly air dries. The final deposit thickness is in the order of few microns that make the network very difficult to be tampered, especially once it gets mechanically embedded (protected) by layers of dielectric materials, i.e. epoxy resins.

Still another improvement consists in applying a shielding layer on top of the tamper proof layers thus avoiding any non destructive analysis of the printed circuit board stack-up layers. Such a shielding layer can be, for example, a plated copper layer.

According to the invention it is a further embodiment the embedding optical polymer waveguides for optical transmission of signals replacing electrical conductive tracks or patterns within the build-up layers of the PCB construction. In such case, the electrical conductive ink is replaced by an optical conductive ink and the steps of the method for embedding the optical conductive tracks are approximately the same.

FIGS. 4a to 4m depict a process in according to algorithm shown in FIG. 3 where the final result can be the implementation of the embedding of short resistive tracks or segment embedded within the PCB stack-up. Those resistive discrete elements are connected to underneath metal layers by the utilization of small holes, e.g., of 50 to 100 μm of diameter, where the ink percolates and adheres to metal. Several of these elements can be created along the same hosting layer, variations in their size and length along with the ink electrical characteristics, deliver the range of resistance values required by the product application.

FIGS. 6a to 6g illustrate the main states of a PCB stack-up when embedding discrete components according to a particular embodiment of the algorithm described by reference to FIG. 3.

Figure 6A:
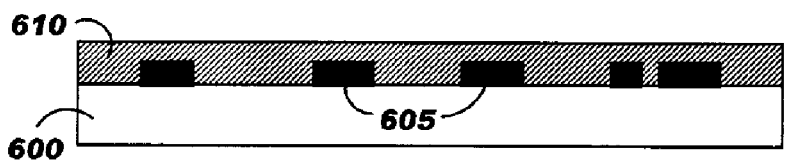
FIGS. 6a to 6g, depicts the main states of a PCB stack-up when embedding integrated resistive discrete components according to the method of the invention.

FIG. 6a shows a PCB core 600 on which conductive tracks 605, e.g., copper tracks, are designed and covered with insulating material 610 such as polymer. It should be noticed that part 600 can be a PCB core, as illustrated, or a partially built-up PCB embedding conductive layers.

Figure 6B:
Figure 6C:
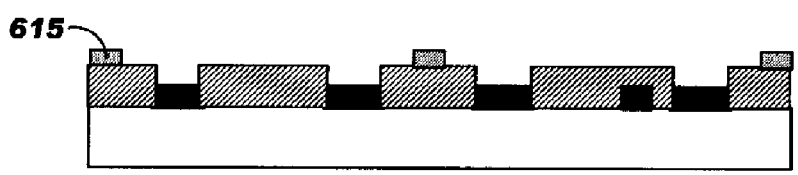

The insulating material 610 is partially removed so as to open vias 615 as depicted on FIG. 6b. In a preferred embodiment the vias are opened using laser ablation.

Then, a plating mask 615 and photoresist material are applied on the surface of the PCB. The photoresist material is exposed and partially removed with the plating mask so as to create holes wherein conductive ink must be deposited.

Figure 6D:

FIG. 6d shows how conductive ink 620 is spread on the PCB. As mentioned above, conductive ink 620 is preferably applied as a paste, allowing a squeegee 625 to spread it on the surface so as to fill the gaps left by the removed mask and to create discrete components. Vias 615 are filled with conductive ink to establish electrical contacts with conductive tracks 605. The preferred embodiment uses a screen printing technique with material having viscosity comprised in the range of about 1000 to 20,000 mPa·s. The composition of the conductive ink is similar to the one described by reference to FIG. 4.

As mentioned above, once the conductive ink has been spread on the PCB, the ink is brought to a higher temperature to facilitate the material flow, which fills the possible gaps left over from the screen printing operation. This "Flow time" also allows the material to become uniform in the distribution over the laminate filling correctly the channels. This flow helps then in obtaining a uniform thickness along the deposited pattern, for example reaching the required 15 µm targeted for this kind of application, compatible with the symmetry in the laminate with the opposite homologous copper plated layer.

The temperature rise, if protracted for a longer time will drive the material to transit from a flowing phase to a start of polymerization, this is a status known as "Gelling" where the flow properties are becoming significantly reduced until they stop completely. If this temperature cycle is then further incremented the real cross linking phase for the material starts, and the material freeze in its flow and shape properties.

Figure 6E:

Then the plating mask is removed as illustrated on FIG. 6e, showing the created resistive discrete components 630 and 635.

Figure 6F:
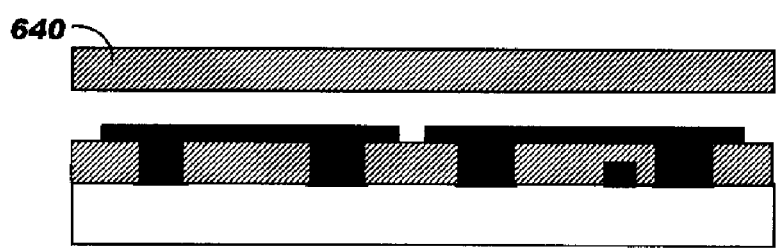

FIG. 6f illustrates the steps consisting in applying a new dielectric layer 640 on the PCB so as to protect resistive discrete components 630 and 635. This dielectric is of the same nature of the ink, i.e., achieving an epoxy on epoxy combination or other inks/dielectric combinations using similar chemistries.

Figure 6G:
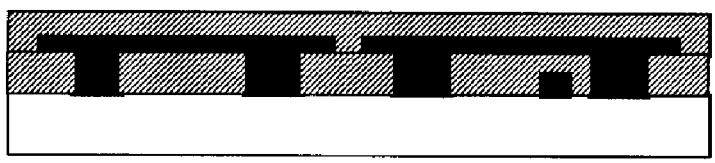

Once the new dielectric layer is deposited the material undergo a polymerization cycle that achieves branching between the polymer chains of the two materials (ink and dielectric) reaching a stronger level of adhesion between the two, as depicted on FIG. 6g. This level of molecular inter-diffusion and grafting during the polymerization cycle makes the selective removal of one of the two materials very difficult to be performed.

Similarly an activation of the gelled or even cured polymer surface by an activator that chemically revert the surface to accept grafting from the newly deposited dielectric material is also a known technique to achieve a strong polymer to polymer adhesion.

Beyond surface activators that promote reactions in the polymers there are also adhesion promoters, like diblock copolymers that can bridge, by the presence of different blocks of repeated units capable to selectively react with one of the two, or more, resins present in the interface.

As mentioned above (and even if it is not shown on FIG. 6), PCB is preferably built simultaneously on both faces to reduce mechanical constraints, as described by reference to FIG. 3.

Naturally, in order to satisfy local and specific requirements, a person skilled in the art may apply to the solution described above many modifications and alterations all of which, however, are included within the scope of protection of the invention as defined by the following claims.

What is claimed is:

1. A method for embedding at least one conductive track in a layer of a printed circuit board stack-up, said method comprising the steps of:
    applying a first plating mask of photoresist covering partially at least one face of a base substrate, said applying a first plating mask comprising the steps of:
        (i) applying a photoresist to said face,
        (ii) patterning said photoresist to create gaps in said photoresist,
    depositing conductive ink as paste in said gaps formed by said plating mask covering partially at least one face of said base substrate,
    liquefying said conductive ink to facilitate uniform distribution
    gelling said conductive ink,
    removing said first plating mask,
    applying a dielectric layer on said conductive ink, and
    solidifying said conductive ink and said dielectric layer.

2. The method of claim 1 wherein each of the steps is repeated at least once to create at least one other layer comprising at least one conductive track.

3. The method of claim 2 wherein the conductive paths of said at least two layers are not aligned.

4. The method of claim 1 wherein said conductive ink comprises polymeric resin.

5. The method of claim 4 wherein said resin is an epoxy resin.

6. The method of claim 1 wherein said conductive ink comprises at least one powder selected from the group consisting of graphite powder, carbon powder, metal powder, and ceramic powder.

7. The method of claim 6 wherein said conductive ink comprises colloidal graphite dispersion in a solvent solution.

8. The method of claim 1 further comprising the steps of:
    applying a colloidal seeding layer on the second face of said base substrate,
    applying a second plating mask covering partially said colloidal seeding layer, and
    plating the unmasked part of said colloidal seeding layer.

9. The method of claim 8 further comprising the step of removing said first or second plating mask.

10. The method of claim 1 wherein the color of said conductive ink is similar to the one of said dielectric layer.

11. The method of claim 1 wherein the viscosity of said conductive ink is comprised between 1000 to 20,000 mPa s.

12. A method for embedding a layer hosting discrete components into a printed circuit board stack-up, said method comprising the steps of:

applying a first plating mask of photoresist covering partially at least one face of a base substrate, said applying a first plating mask comprising the steps of:
(i) applying a photoresist to said face,
(ii) patterning said photoresist to create gaps in said photoresist, depositing conductive ink as paste in said gaps formed by said plating mask covering partially at least one face of said base substrate, liquefying said conductive ink to facilitate uniform distribution,
gelling said conductive ink,
removing said first plating mask,
applying a dielectric layer on said conductive ink, and
solidifying said conductive ink and said dielectric layer.

13. The method of claim 12 wherein said discrete components comprise at least one resistive discrete component.

* * * * *